(12) United States Patent
Noguchi et al.

(10) Patent No.: US 7,220,995 B2
(45) Date of Patent: May 22, 2007

(54) SUBSTRATE FOR ELECTRONIC DEVICE, ELECTRONIC DEVICE AND METHODS OF MANUFACTURING SAME

(75) Inventors: Takao Noguchi, Tokyo (JP); Hisatoshi Saitou, Tokyo (JP); Hidenori Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 378 days.

(21) Appl. No.: 10/817,907

(22) Filed: Apr. 6, 2004

(65) Prior Publication Data
US 2005/0029629 A1   Feb. 10, 2005

(30) Foreign Application Priority Data
Aug. 7, 2003   (JP) .............. 2003-206559

(51) Int. Cl.
*H01L 27/15*   (2006.01)
(52) U.S. Cl. .......................... 257/79; 257/94
(58) Field of Classification Search ............ 257/79, 257/94, 753, 783, 12, 22, 183; 148/33.4
See application file for complete search history.

(56) References Cited

U.S. PATENT DOCUMENTS 6,045,626 A * 4/2000 Yano et al. ............... 148/33.4
6,258,459 B1   7/2001 Noguchi et al.

FOREIGN PATENT DOCUMENTS

JP   A 11-260835   9/1999
JP   A 11-312801   11/1999

OTHER PUBLICATIONS

U.S. Appl. No. 10/650,764, filed Aug. 29, 2003, Noguchi et al.

* cited by examiner

*Primary Examiner*—Tuan H. Nguyen
(74) *Attorney, Agent, or Firm*—Oliff & Berridge, PLC

(57) ABSTRACT

A substrate for an electronic device comprises a base, an adhesion film stacked on the base, and a conductor film stacked on the adhesion film. The adhesion film is a non-epitaxial film including a crystal having a wurtzite crystal structure. The electronic device comprises the substrate and a functional film having a specific function and disposed on the substrate.

9 Claims, 4 Drawing Sheets

SUBSTRATE FOR ELECTRONIC DEVICE, ELECTRONIC DEVICE AND METHODS OF MANUFACTURING SAME

BACKGROUND OF THE INVENTION

1. Field of the Invention

The present invention relates to a substrate for an electronic device, an electronic device, and methods of manufacturing such a substrate and an electronic device that are applied to semiconductor devices such as light-emitting diodes and laser diodes, dielectric devices such as thin-film capacitors and ferroelectric nonvolatile memories, and piezoelectric devices such as thin-film bulk acoustic oscillators and surface acoustic wave elements.

2. Description of the Related Art

A variety of electronic devices have been designed and made practical. Such electronic devices are made of various types of substrates on which functional films made of, for example, semiconductors, dielectrics or piezoelectric materials are formed. Examples of electronic devices using semiconductor films are light-emitting diodes and semiconductor lasers. Examples of electronic devices using dielectric films are ferroelectric nonvolatile memories and infrared sensors. Examples of electronic devices using piezoelectric films are thin-film bulk acoustic oscillators.

For such electronic devices the functional films made of, for example, semiconductors, dielectrics or piezoelectric materials are important part that determines the performance characteristics of the electronic devices. Accordingly, it is required to form the functional films that exhibit an excellent crystallinity to obtain the electronic devices having enhanced performance characteristics. To form the functional films that exhibit an excellent crystallinity, it is important to not only optimize the method and conditions for film formation but also optimize the crystallinity of the base layer on which each functional film is formed. The crystallinity of the base layer is particularly important when the functional film is formed through epitaxial growth.

The functional films of many of electronic devices are each formed on a conductor film that serves as a lower electrode. In this case, the conductor film as the lower electrode preferably has an excellent crystallinity.

The Published Unexamined Japanese Patent Application Heisei 11-260835 (1999) discloses a substrate for an electronic device formed by stacking a buffer layer, a surface layer and a metal thin film one by one on a single-crystal Si substrate, wherein the surface layer includes a nitride epitaxial film having a wurtzite crystal structure and/or an oxide epitaxial film having a wurtzite crystal structure.

The Published Unexamined Japanese Patent Application Heisei 11-312801 (1999) discloses a multilayer thin film having a metal thin film that is an epitaxial film of (100) single-oriented cubic crystal, and a buffer layer having a {111} facet located at the interface with the metal thin film.

According to the techniques disclosed in the abovementioned Published Unexamined Japanese Patent Application Heisei 11-260835 and Published Unexamined Japanese Patent Application Heisei 11-312801, the buffer layer is formed on the substrate through epitaxial growth, and furthermore, the conductor film to be the lower electrode is formed on the buffer layer through epitaxial growth. The conductor film having an excellent crystallinity is thereby formed.

According to the techniques disclosed in the abovementioned Published Unexamined Japanese Patent Application Heisei 11-260835 and Published Unexamined Japanese Patent Application Heisei 11-312801, the buffer layer and the conductor film are formed on the substrate through epitaxial growth. As a result, there arises a problem that it is difficult to fabricate the conductor film having an excellent crystallinity because, for example, a process performed at a temperature of 900° C. or higher is required.

When an epitaxial film is intended to be formed directly on the substrate, the following problem may arise. The epitaxial growth means that crystal growth is effected in such a manner that the atoms are oriented in accordance with the orientation of the atoms of the crystal of the base layer. Therefore, if the base layer is made of an amorphous material such as glass or silicon oxide, it is impossible to form an epitaxial film on such a base layer.

It is possible to easily obtain a Pt thin film having an excellent crystallinity in which the (111) plane is single-oriented to be parallel to the substrate surface through a method in which a film of silicon oxide or silicon nitride, for example, is formed on a silicon (Si) substrate, and on this film, a platinum (Pt) thin film as a conductor film is vacuum-deposited at a temperature around 500° C. However, the Pt thin film has a serious problem that an absolute contact is not established between the Pt thin film and the base layer and the Pt thin film is easily removed, which affects the reliability of the process and the electronic device.

If a Pt film is formed directly on a glass substrate, the contact between the glass substrate and the Pt film is not sufficient. If a metal thin film is formed directly on a Si substrate, silicide is likely to be formed and it is difficult to obtain a metal thin film having a good crystallinity.

The inventors of the present invention have considered a method of forming a metal thin film on a substrate, an adhesion film of Ti, Cr, $TiO_2$, or $Al_2O_3$, for example, being disposed between the substrate and the metal thin film. Through this method, however, it is impossible to form a metal thin film having a crystallinity sufficient for forming a functional film having a good crystallinity on the metal thin film.

As thus described, it is difficult through the conventional methods to form a conductor thin film on the substrate, the conductor thin film having both of an excellent crystallinity and an excellent adhesion property that allows a close contact with the substrate. Novel techniques for achieving this object have been sought.

OBJECT AND SUMMARY OF THE INVENTION

It is an object of the invention to provide a substrate for an electronic device, the substrate comprising a conductor film that exhibits an excellent crystallinity and an excellent adhesion to a base, and an electronic device comprising such a substrate, and methods of manufacturing the substrate and the electronic device.

A substrate for an electronic device of the invention comprises a base, an adhesion film stacked on the base, and a conductor film stacked on the adhesion film. The adhesion film is a non-epitaxial film including a crystal having a wurtzite crystal structure.

A method of manufacturing a substrate for an electronic device of the invention is a method of manufacturing the substrate comprising a base, and an adhesion film and a conductor film that are stacked on the base one by one. The method comprises the steps of forming the adhesion film on the base and forming the conductor film on the adhesion film. The adhesion film is a non-epitaxial film including a crystal having a wurtzite crystal structure.

According to the substrate for the electronic device or the method of manufacturing the same of the invention, the adhesion film is disposed between the base and the conductor film, the adhesion film being made of a non-epitaxial film including a crystal having a wurtzite crystal structure. As a result, the crystallinity of the conductor film and the adhesion of the conductor film to the base are both improved.

According to the substrate or the method of manufacturing the same of the invention, the adhesion film may be a polycrystalline film.

According to the substrate or the method of manufacturing the same of the invention, the adhesion film may be a film oriented such that a (0001) plane of the wurtzite crystal structure is parallel to a surface of the base.

According to the substrate or the method of manufacturing the same of the invention, the adhesion film may have an arithmetic mean roughness of 10 nanometers or smaller.

According to the substrate or the method of manufacturing the same of the invention, the conductor film may be a film that includes a crystal having a face-centered cubic lattice structure and is oriented such that a (111) plane of the face-centered cubic lattice structure is parallel to a surface of the base.

According to the substrate or the method of manufacturing the same of the invention, the conductor film may be a film that includes a crystal having a hexagonal close-packed structure and is oriented such that a (0001) plane of the hexagonal close-packed structure is parallel to a surface of the base.

According to the substrate or the method of manufacturing the same of the invention, at least a portion of the base that touches the adhesion film may be amorphous.

An electronic device of the invention comprises the substrate for the electronic device of the invention and a functional film having a specific function and disposed on the substrate. The functional film may be any of a piezoelectric film, a dielectric film and a semiconductor film.

A method of manufacturing an electronic device of the invention is a method of manufacturing the electronic device comprising a substrate for the electronic device and a functional film having a specific function and disposed on the substrate. The method comprises the steps of fabricating the substrate by the method of manufacturing the substrate for the electronic device of the invention, and forming the functional film on the substrate.

Other and further objects, features and advantages of the invention will appear more fully from the following description.

DESCRIPTION OF PREFERRED EMBODIMENT

Figure 1:
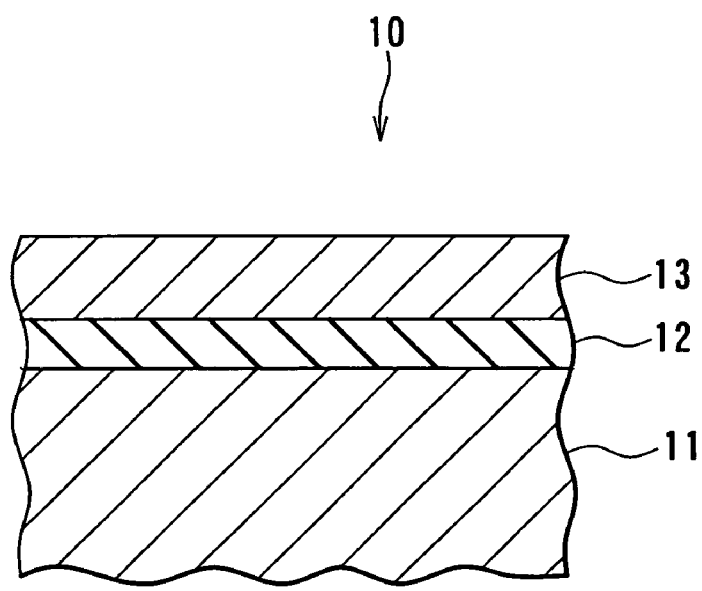
FIG. 1 is a cross-sectional view of a substrate for an electronic device of an embodiment of the invention.

A preferred embodiment of the invention will now be described in detail with reference to the accompanying drawings. Reference is now made to FIG. 1 to describe the configuration of a substrate for an electronic device of the embodiment of the invention. FIG. 1 is a cross-sectional view of the substrate of the embodiment.

As shown in FIG. 1, the substrate 10 for the electronic device of the embodiment comprises a base 11, an adhesion film 12 stacked on the base 11, and a conductor film 13 stacked on the adhesion film 12. The adhesion film 12 is a non-epitaxial film including a crystal having a wurtzite crystal structure. The electronic device of the embodiment comprises the substrate 10 and a functional film that is disposed on the substrate 10 and has a specific function. The conductor film 13 may serve as a lower electrode electrically connected to the functional film.

The functional film may be a semiconductor film, a dielectric film or a piezoelectric film, for example. The electronic device may be a thin-film capacitor. The thin-film capacitor may be fabricated through forming a conductor film to be an upper electrode on the functional film made of a dielectric film and thereby making a capacitor structure made up of the lower electrode, the functional film and the upper electrode. The electronic device may also be a thin-film bulk acoustic oscillator. The thin-film bulk acoustic oscillator may be fabricated through forming a conductor film to be an upper electrode on the functional film made of a piezoelectric film. The thin-film bulk acoustic oscillator may have the base 11 that is processed by etching, for example. The electronic device may also be a light-emitting element or a light-receiving element. In such a case, a semiconductor film is utilized as the functional film. The base 11, the adhesion film 12 and the conductor film 13 will now be described in detail one by one.

[Base]

The base 11 may be made up of a single layer or a plurality of layers. For example, the base 11 may be made up of only a substrate having a single layer, or made up of this substrate on which another layer or more are formed.

The substrate used for the base 11 may be a single-crystal substrate of Si or sapphire, a ceramic substrate of alumina ($Al_2O_3$) or AlTiC ($Al_2O_3$—TiC), or a substrate made of quartz or glass. The material of the substrate may be appropriately selected, regarding the factors such as the manufacturing process of the electronic device that uses the base 11, the properties of the electronic device to be manufactured, and the manufacturing costs. For example, if a process performed at a temperature higher than 600° C. is required, the substrate of Si or quartz is preferred. To manufacture the substrate 10 that is inexpensive, the substrate of Si or glass is preferred. Above all, a single-crystal Si substrate is most preferred since it is inexpensive and the wafer processing technique of higher level has been established.

The substrate used for the base 11 may have a surface on which a film is formed in advance or may have a surface on which mechanical processing, such as polishing, is performed. For example, many industrial substrates such as Si substrates have surfaces on which mechanical processing, such as polishing, is performed. Some ceramic substrates have surfaces on each of which a film is formed to reduce a surface roughness. Furthermore, such a film may be polished. Any of those substrates may be used for the base 11.

The base 11 may be a Si substrate with a surface on which a $SiO_2$ film is formed by thermal oxidation. The base 11 may also be made up of a substrate on which a layered film made up of a plurality of layers, such as an optical reflection film, is formed.

At least a portion of the base 11 that is in contact with the adhesion film 12 may be amorphous such as glass or $SiO_2$.

[Adhesion Film]

The adhesion film 12 is a non-epitaxial film including a crystal having a wurtzite crystal structure. The adhesion film 12 may be a polycrystalline film. The adhesion film 12 is preferably made of a compound of nitrogen and at least one element selected from the group III such as Al, Ga and In, or made of an oxide or a sulfide of a group-II element such as Be or Zn. In particular, AlN is the most preferred material of the adhesion film 12 since AlN is stable in an atmosphere and easily formed into a film having a good crystallinity by reactive sputtering.

The adhesion film 12 is preferably a (0001) oriented film oriented such that the (0001) plane of a wurtzite crystal structure is parallel to the surface of the base 11. More preferably, the adhesion film 12 is a (0001) single-oriented film oriented such that the (0001) plane of a wurtzite crystal structure is parallel to the surface of the base 11.

In the present patent application the oriented film is a film wherein, when measurement by X-ray diffraction is performed, the greatest peak intensity of reflection in the target plane is greater than the peak intensity of reflection in a plane other than the target plane. In the present application the single-oriented film is a film wherein the peak intensity of reflection in a plane other than the target plane is 10 percent or smaller of the greatest peak intensity of reflection in the target plane.

The (0001) plane of the wurtzite crystal structure is regarded as a structure in which atoms are located in the center and the vertexes of a regular hexagon. On the adhesion film 12 that is oriented so as to have the (0001) plane in which the atoms are aligned in such a manner, the conductor film 13 having a crystal structure of a face-centered cubic lattice structure or a hexagonal close-packed structure may be formed. It is thereby possible to easily form a crystalline metal thin film that is oriented to have the (0001) plane of a hexagonal close-packed structure or the (111) plane of a face-centered cubic lattice structure that has a regular-hexagonal atomic alignment which is similar to the (0001) plane of the wurtzite crystal structure. As thus described, the adhesion film 12 is the (0001) oriented film that is oriented to have the (0001) plane of the wurtzite crystal structure parallel to the surface of the base 11, so as to form the conductor film 13 that is oriented to have the (111) plane of the face-centered cubic lattice structure or the (0001) plane of the hexagonal close-packed structure and that has an extremely good crystallinity.

Methods of determining the orientation of the adhesion film 12 including a crystal having the wurtzite crystal structure will now be described. The methods of determining the orientation of the adhesion film 12 include X-ray diffraction, reflection high-energy electron diffraction (RHEED), and observation using a transmission electron microscope.

The method of determining the orientation of the adhesion film 12 by X-ray diffraction will be described first. In this method the X-ray diffraction intensity of the adhesion film 12 is measured through the use of the θ-2θ method. The adhesion film 12 measured is a (0001) oriented film if the greatest peak intensity of reflection in the (000L) plane of X-ray diffraction is greater than the peak intensity of reflection in a plane other than the (000L) plane. Furthermore, the adhesion film 12 measured is a (0001) single-oriented film if the peak intensity of reflection in a plane other than the (000L) plane is 10 percent or smaller of the greatest peak intensity of reflection in the (000L) plane. Here, the (000L) plane generally represents a plane equivalent to the plane where L is an integer, such as a (0001) plane or a (0002) plane.

The method of determining the orientation of the adhesion film 12 by RHEED will now be described. In this method the surface of the adhesion film 12 is observed by RHEED. The adhesion film 12 measured is a (0001) oriented film if a diffraction pattern of the (0001) plane of a wurtzite crystal structure is observed.

The method of determining the orientation of the adhesion film 12 by using a transmission electron microscope will now be described. In this method a cross section, the top surface or the bottom surface of the adhesion film 12 is observed through the use of the transmission electron microscope. The orientation of the crystal is determined by the diffraction pattern thus obtained.

If the thickness of the adhesion film 12 is very thin, it may be impossible by X-ray diffraction to obtain a sufficient X-ray diffraction intensity, and it may be difficult to make the above-mentioned comparison of the X-ray diffraction peak intensities. In addition to the adhesion film 12, if the substrate 10 incorporates another film that is made up of the same elements as the adhesion film 12 and that has the same crystal structure as the adhesion film 12, it may be impossible to separate the peak of X-ray diffraction of the adhesion film 12 from the peak of X-ray diffraction of the other film, and it may be impossible to determine the orientation of the adhesion film 12. In such a case, it is preferred to use the above-mentioned RHEED or the method using the transmission electron microscope to determine the orientation of the adhesion film 12.

The adhesion film 12 is preferably a crystallized film, and more preferably a (0001) oriented polycrystalline film.

The arithmetic mean roughness Ra of the top surface of the adhesion film 12 is preferably 10 nanometers (nm) or smaller, and more preferably 2 nm or smaller. If the arithmetic mean roughness Ra of the top surface of the adhesion film 12 is greater than 10 nm, the crystallinity of the conductor film 13 formed on the adhesion film 12 may be affected.

The thickness of the adhesion film 12 may be selected so as to suit the properties of the electronic device to be fabricated. For example, if the electronic device to be fabricated is a filter using a thin-film bulk acoustic oscillator, the thickness of the adhesion film 12 may be chosen so that the bandwidth, the minimum insertion loss, the attenuation, and the temperature characteristic of the filter are optimized.

In cases in which the thickness of the adhesion film 12 is not important or does not depend on the properties of the electronic device, the typical thickness of the adhesion film 12 is preferably 1 to 1000 nm, and more preferably 5 to 100 nm. If the thickness of the adhesion film 12 is too thin, problems may arise. For example, it is impossible to form the adhesion film 12 including a crystal of a wurtzite crystal structure having a sufficient cryatallinity and it is thereby impossible to form the conductor film 13 having a good crystallinity on the adhesion film 12. Another example of the problems is that a sufficient adhesion will not be established between the base 11 and the conductor film 13. In contrast, if the thickness of the adhesion film 12 is too thick, there arises a problem that it takes a longer period to form the film and the throughput of manufacturing the substrate 10 is thereby reduced.

The inventors of the present invention have found that, when the adhesion film 12 is an AlN film formed by reactive magnetron sputtering, the AlN film having a thickness of about 5 nm allows the conductor film 13 to be formed on the adhesion film 12, the conductor film 13 having a sufficient crystallinity and providing a sufficient adhesion to the base 11. This feature will now be described.

Figure 2:
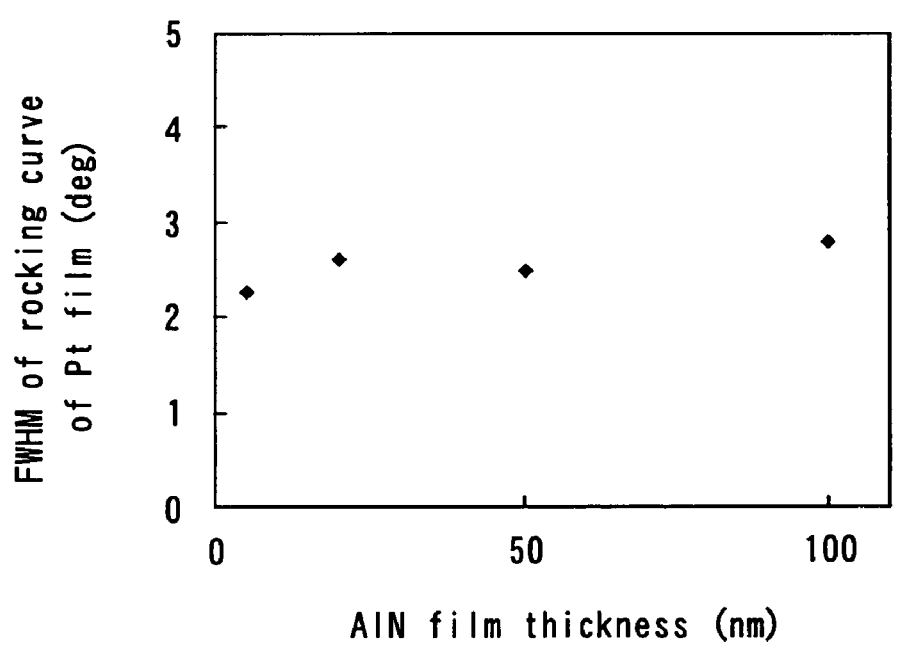
FIG. 2 is a plot showing the relationship between the thickness of an AlN film that is an adhesion film of the substrate for the electronic device of the embodiment of the invention and the crystalinity of a Pt film that is a conductor film of the substrate.

FIG. 2 is a plot showing an example of the relationship between the thickness of an AlN film as the adhesion film 12 and the crystallinity of a Pt film as the conductor film formed on the AlN film. In this example the AlN film is formed by reactive RF magnetron sputtering. The Pt film is formed by vacuum deposition. The AlN film corresponds to the adhesion film 12 and the Pt film corresponds to the conductor film 13. In FIG. 2 the horizontal axis indicates the thickness of the AlN film while the vertical axis indicates the full width at half maximum (FWHM) of the rocking curve of reflection in the (111) plane of the Pt film obtained by X-ray diffraction. The rocking curve of X-ray diffraction means the intensity distribution curve of the diffraction line when a monochrome X ray is applied to the crystal plane from a specific direction and the crystal is rotated near the orientation that satisfies the Bragg condition. The FWHM of the rocking curve is reduced if the crystallinity is complete. Therefore, a smaller FWHM of the rocking curve means a better crystallinity. In the example shown in FIG. 2 the Pt film having a stable crystallinity is obtained when the AlN film has a thickness of 5 to 100 nm.

Any of the Pt films formed in the above-described manner did not cause any separation in the tape test performed in accordance with the standard 'JIS H 8504-15' of the Japan Industrial Standard and exhibited a good adhesion.

The adhesion film 12 may be formed directly on a substrate of Si or glass, for example, or may be formed on a film having one layer or more made of $SiO_2$ or $Al_2O_3$, for example, which is formed on a substrate. For example, as will be specifically described later, to fabricate a thin-film bulk acoustic oscillator having an acoustic reflection film as the electronic device, it is possible to alternately stack two types of layers having different acoustic impedances and to form the adhesion film 12 thereon.

[Conductor Film]

According to the configuration of the electronic device 20, the conductor film 13 is disposed below the functional film and may serve as the lower electrode.

If the functional film made of a piezoelectric material such as AlN or ZnO is used, the conductor film 13 is preferably a metal thin film that includes a crystal of a face-centered cubic lattice structure and is oriented such that the (111) plane of the face-centered cubic lattice structure is parallel to the surface of the base 11, or a metal thin film that includes a crystal of a hexagonal close-packed structure and is oriented such that the (0001) plane of the hexagonal close-packed structure is parallel to the surface of the base 11. In this case, the conductor film 13 is more preferably a single-oriented film.

Here, the single-oriented film oriented such that the (111) plane of the face-centered cubic lattice structure is parallel to the surface of the base 11 is a film wherein the peak intensity of reflection in a plane other than the (hhh) plane is 10 percent or smaller of the greatest peak intensity of reflection in the (hhh) plane, according to the measurement using the θ-2θ method. The (hhh) plane generally represents a plane equivalent to the plane where h is an integer, such as the (111) plane or the (222) plane.

A piezoelectric thin film made of AlN or ZnO and including a crystal of a wurtzite crystal structure may be formed on the conductor film 13 made of a metal thin film oriented such that the (111) plane of the face-centered cubic lattice structure is parallel to the surface of the base 11, or a metal thin film oriented such that the (0001) plane of the hexagonal close-packed structure is parallel to the surface of the base 11. The piezoelectric thin film having a good crystallinity is thereby formed through epitaxial growth. The reason is described in detail in the U.S. patent application Ser. No. 10/650,764. The reason will now be briefly described.

If the metal thin film is a (111) oriented film, a wurtzite thin film formed on the metal thin film epitaxially grows on the metal thin film so that the <11-20> axis in the plane of the wurtzite thin film is made parallel to the <1-10> axis in the plane of the metal thin film. If the metal thin film is a (0001) oriented film, the wurtzite thin film epitaxially grows on the metal thin film so that the <11-20> axis in the plane of the wurtzite thin film is made parallel to the <11-20> axis in the plane of the metal thin film. That is, attention being focused on a specific crystal grain of the (111) oriented metal thin film, the <1-10> axis of the grain is parallel to the <11-20> axis of the crystal grain of the wurtzite thin film that has grown on the specific grain of the metal thin film. Attention being focused on a specific crystal grain of the (0001) oriented metal thin film, the <11-20> axis of the grain is parallel to the <11-20> axis of the crystal grain of the wurtzite thin film that has grown on the specific grain of the metal thin film. In the foregoing description each crystal axis is indicated as <11-20>, for example, where '-2' means 2 with an upper bar. The minus signs of the other crystal axes and crystal planes mean the same.

The crystallinity of the conductor film 13 will now be described. The conductor film 13 preferably has such a crystallinity that, when X-ray diffraction is performed, the FWHM of the rocking curve of reflection in the (111) plane of the face-centered cubic lattice structure or the reflection in the (0002) plane of the hexagonal close-packed structure is 5 degrees or smaller, or more preferably 3 degrees or smaller. As described above, a smaller FWHM of the rocking curve means a better crystallinity.

As described above, when the conductor film 13 is made of a metal thin film oriented such that the (0001) plane of the hexagonal close-packed structure is parallel to the surface of the base 11, the crystallinity of the conductor film 13 is evaluated through the use of the FWHM of the rocking curve of reflection in the (0002) plane of the hexagonal close-packed structure. This is because the reflection from the (0001) plane is cancelled out by the reflection from the (0002) plane that has half the space of the (0001) plane.

The conductor film 13 may be a film including a crystal that has epitaxially grown on the adhesion film 12 including a crystal having a wurtzite structure. In this case, the crystal of the conductor film 13 that has epitaxially grown on the adhesion film 12 and the crystal of the wurtzite structure of the adhesion film 12 that is the base of the conductor film 13 preferably have an orientational relationship the same as the relationship between the above-mentioned metal thin film oriented such that the (111) plane of the face-centered cubic lattice structure is parallel to the surface of the base 11, or the metal thin film including a crystal of the hexagonal close-packed structure and oriented such that the (0001) plane of the hexagonal close-packed structure is parallel to the surface of the base 11, and the wurtzite thin film epitaxially growing on the metal thin film.

The conductor film 13 is preferably made of a material whose main component is at least one of the group consisting of Pt, Au, Ir, Os, Re, Pd, Rh and Ru. The crystal of Pt, Au, Ir, Pd or Rh has a face-centered cubic lattice structure. The crystal of Os, Re or Ru has a hexagonal close-packed structure. A film whose main component is any of these metals has a surface that is easily kept clean and even if the surface is contaminated, it is easily cleaned by ashing or heat processing, for example. It is possible to easily form a functional film of ZnO, for example, having a good crystallinity on a clean surface of the conductor film 13.

In addition to the above-mentioned example, the conductor film 13 may be a metal thin film made of Mo or W, for example, and including a crystal having a body-centered cubic structure, or a conductive oxide film made of $SrRuO_3$, for example, and having a perovskite structure. Such a film is capable of providing a good adhesion to the adhesion film 12.

The conductor film 13 preferably has a thickness of 10 to 1000 nm, and more preferably 50 to 300 nm. If the conductor film 13 is too thin, the sheet resistance is increased so that it is not suitable for the lower electrode that constitutes the electronic device. If the conductor film 13 is too thick, the period of time required for the manufacturing process and the material costs are increased, which is not favorable, either.

The conductor film 13 preferably has a property of providing a sufficient adhesion to the layer touching the bottom surface of the conductor film 13. To be specific, the conductor film 13 preferably has an adhesion of 1.18 N/centimeter or greater that is the adhesion of a cellophane adhesive tape defined by the standard 'JIS Z 1522' of the Japan Industrial Standard.

[Method of Manufacturing the Substrate for the Electronic Device]

A method of manufacturing the substrate 10 for the electronic device of the embodiment will now be described. The method comprises the steps of forming the adhesion film 12 on the base 11 and forming the conductor film 13 on the adhesion film 12. The adhesion film 12 is a non-epitaxial film including a crystal having a wurtzite structure.

According to the above-mentioned method, methods of forming the films are not limited to specific methods but the following methods are preferred. To form the adhesion film 12, sputtering or metal organic chemical vapor deposition (MOCVD) is preferred, and sputtering is more preferred. Using sputtering enables formation of the adhesion film 12 having a good crystallinity at a relatively low temperature from a room temperature to 200° C.

To form the adhesion film 12 made of an AlN film, it is preferred to use RF magnetron reactive sputtering. In this case, Al is used for the cathode and an Ar gas and a nitrogen gas are introduced to the reaction chamber to perform RF magnetron sputtering where the substrate temperature is about 200° C. An excellent AlN film is thereby formed.

To form the conductor film 13, vacuum deposition, sputtering or chemical vapor deposition (CVD) is preferred, and vacuum deposition is more preferred.

To form the conductor film 13 by vacuum deposition, the temperature of the substrate is preferably 300 to 800° C., and more preferably 400 to 600° C. If the temperature of the substrate is too low, it is impossible to obtain the conductor film 13 having a good crystallinity. If the temperature of the substrate is too high, the property of the surface of the conductor film 13 may be affected and/or pinholes may result.

[Electronic Device and Method of Manufacturing the Same]

An electronic device and a method of manufacturing the same according to the embodiment will now be described. The electronic device comprises at least the substrate 10 for the electronic device of the embodiment and a functional film that is disposed on the substrate 10 and has a specific function. The method of manufacturing the electronic device of the embodiment comprises the steps of fabricating the substrate 10 and forming the functional film on the substrate 10. The step of fabricating the substrate 10 comprises the steps of forming the adhesion film 12 on the base 11 and forming the conductor film 13 on the adhesion film 12.

The functional film is disposed on the conductor film 13 of the substrate 10. The functional film may be a piezoelectric film made of a piezoelectric material such as ZnO, a semiconductor film made of a semiconductor such as GaN, or a ferroelectric film made of a ferroelectric such as lead zirconate titanate (PZT).

For example, the lower electrode as the conductor film 13 is patterned, and a piezoelectric film as the functional film is formed on the lower electrode. Furthermore, the upper electrode is formed on the piezoelectric film and patterned. An electronic device such as a thin-film bulk acoustic oscillator or a head for an inkjet printer is thereby fabricated. If a pyroelectric thin film is used as the functional film, an infrared sensor, for example, is fabricated. If a ferroelectric film is used as the functional film, an electronic device such as a ferroelectric nonvolatile memory is fabricated. It is also possible to provide a plurality of semiconductor layers on the lower electrode and form a pn junction so as to make an electronic device such as a diode, a transistor or a solar cell. Alternatively, an active layer may be further provided to make an electronic device such as a light-emitting diode or a laser diode.

Figure 3:
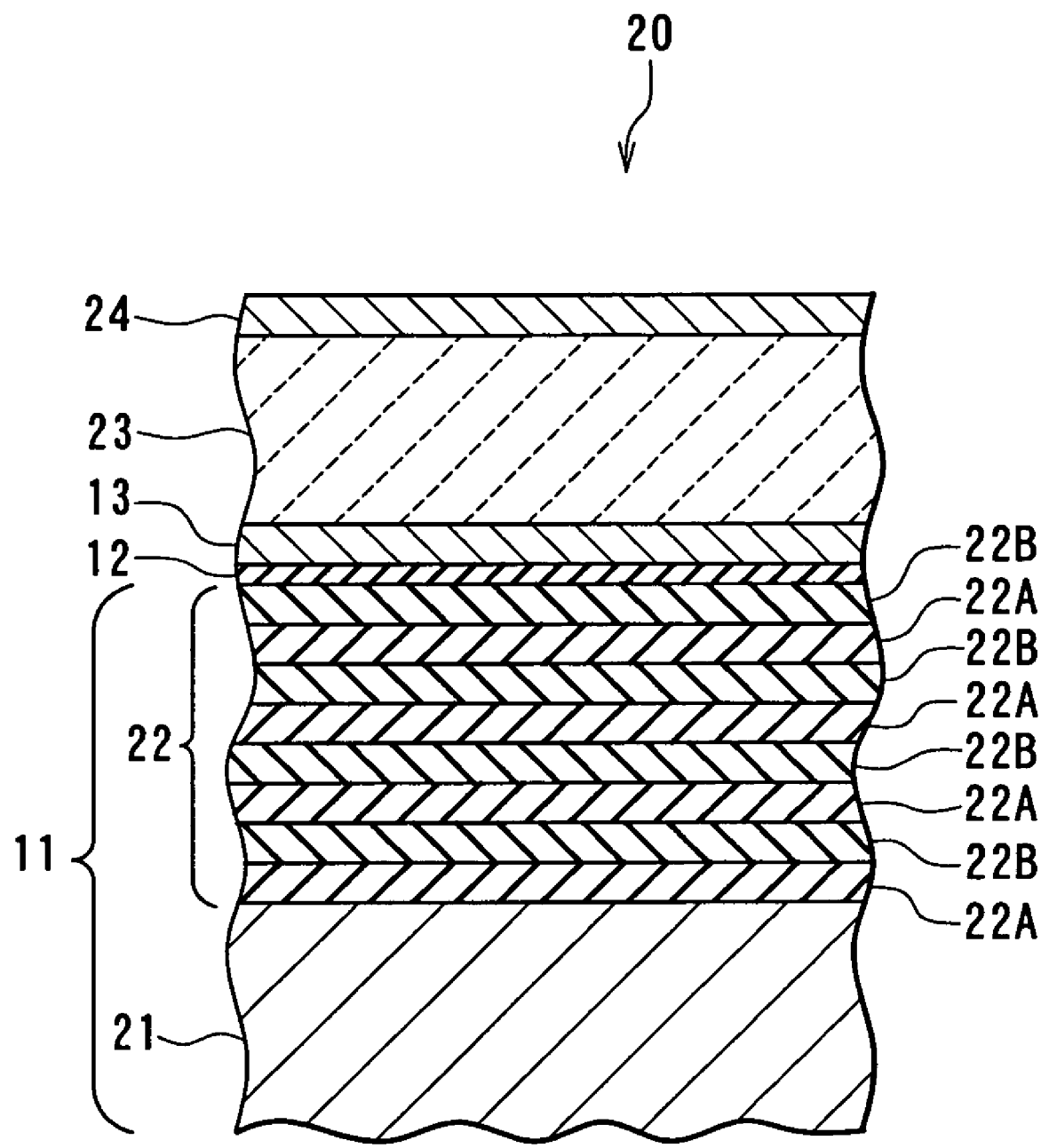
FIG. 3 is a cross-sectional view of an example of the electronic device of the embodiment of the invention.

FIG. 3 is a cross-sectional view of an example of the electronic device 20 of the embodiment. The electronic device 20 of FIG. 3 is a thin-film bulk acoustic oscillator. The electronic device 20 comprises: the base 11; and the adhesion film 12, the conductor film 13, the piezoelectric film 23 as the functional film, and an upper electrode 24 that are stacked on the base 11 one by one. The base 11 incorporates a substrate 21 made of Si, for example, and an acoustic reflection film 22 stacked on the substrate 21. The acoustic reflection film 22 is made up of two types of layers having different acoustic impedances, that is, first and second dielectric layers 22A and 22B alternately stacked. According to the embodiment, the acoustic impedance of the first dielectric layers 22A is greater than that of the second dielectric layers 22B. The first dielectric layers 22A may be made of any of AlN, ZnO and $Al_2O_3$, for example. The second dielectric layers 22B may be made of $SiO_2$, for example.

The conductor film 13 may be made of Pt, for example. The piezoelectric film 23 may be made of ZnO, for example. The upper electrode 24 may be made of Al, for example.

A high-frequency excitation voltage is applied to the conductor film 13 as the lower electrode and the upper electrode 24 of the electronic device 20 of FIG. 3. This excitation voltage is applied to the piezoelectric film 23. The piezoelectric film 23 is thereby excited and bulk elastic waves that propagate in the direction of thickness are generated. The piezoelectric film 23 resonates when the frequency of the excitation voltage is a specific resonant frequency. The acoustic reflection film 22 has a function of confining the elastic waves generated by the piezoelectric film 23 inside the piezoelectric film 23.

Figure 4:
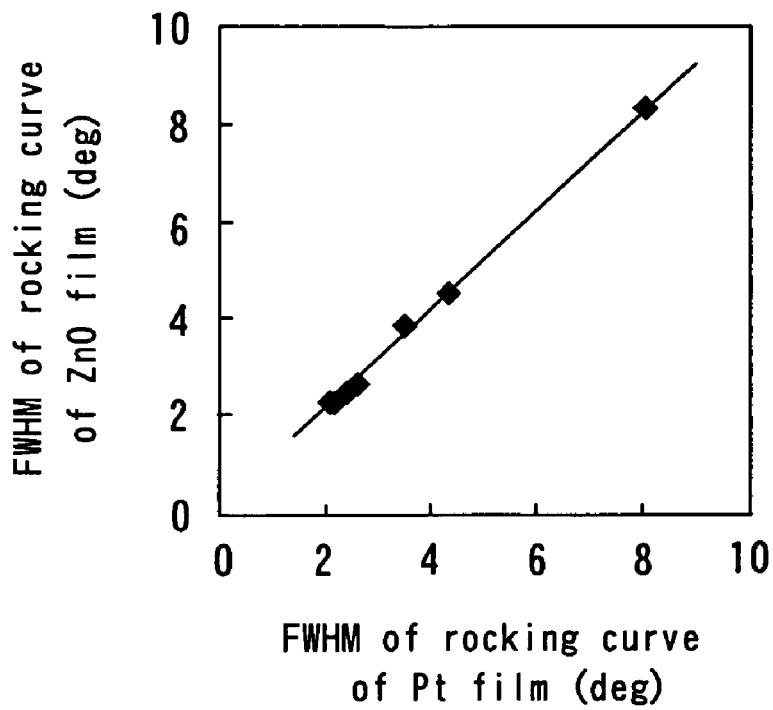
FIG. 4 is a plot showing the relationship between the full width at half maximum (FWHM) of the rocking curve of the Pt film that is the conductor film in the electronic device of the embodiment and the FWHM of the rocking curve of a ZnO film that is a piezoelectric film of the electronic device.

The relationship between the crystallinity of the conductor film 13 and the crystallinity of the piezoelectric film 23 of the electronic device 20 of FIG. 3 will now be described. To examine the relationship between the crystallinity of the conductor film 13 and the crystallinity of the piezoelectric film 23, a plurality of electronic devices 20 of FIG. 3 were prototyped. The conductor film 13 of each of the electronic devices 20 prototyped was a single-oriented Pt film that was oriented such that the (111) plane of a face-centered cubic lattice structure was parallel to the surface of the base 11. The piezoelectric film 23 of each of the electronic devices 20 was a ZnO film. Next, the relationship between the crystallinity of the conductor film 13 and the crystallinity of the piezoelectric film 23 of each of the electronic devices 20 was examined. To be specific, the relationship between the FWHM of the rocking curve of the Pt film as the conductor film 13 and the FWHM of the rocking curve of the ZnO film as the piezoelectric film 23 was examined. The result is shown in FIG. 4. As shown in FIG. 4, the FWHM of the rocking curve of the Pt film and the FWHM of the rocking curve of the ZnO film were nearly equal. It is thus noted that, if the crystallinity of the Pt film is improved, the crystallinity of the ZnO film formed thereon is improved, too.

Figure 5:
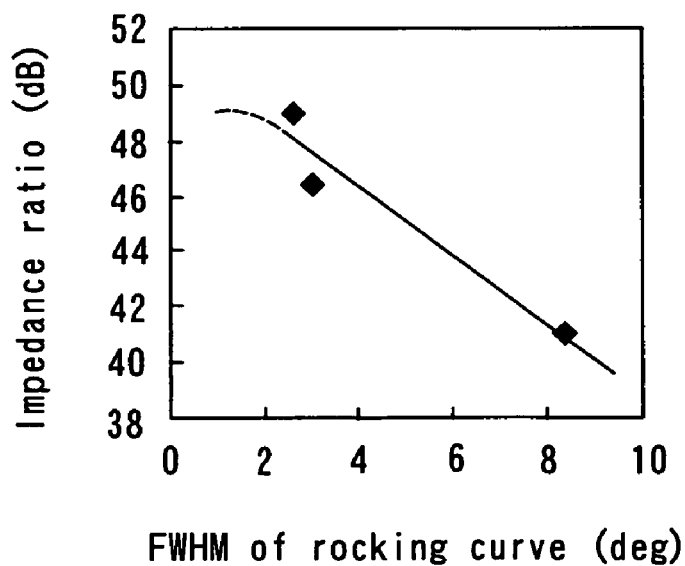
FIG. 5 is a plot showing the relationship between the FWHM of the rocking curve of the ZnO film that is the piezoelectric film of the electronic device of the embodiment and the impedance ratio of the electronic device.
Figure 6:
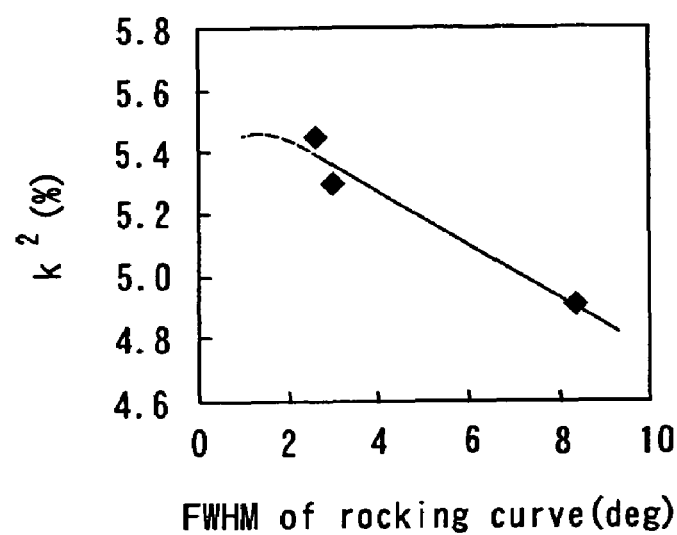
FIG. 6 is a plot showing the relationship between the FWHM of the rocking curve of the ZnO film that is the piezoelectric film of the electronic device of the embodiment and the effective electromechanical coupling coefficient of the electronic device.

The relationship between the crystallinity of the piezoelectric film 23 of the electronic device 20 prototyped and the electrical property of the electronic device 20 will now be described. Here, the relationship between the FWHM of the rocking curve of the ZnO film as the piezoelectric film 23 and the ratio of the impedance at the resonant frequency of the electronic device 20 versus the impedance at the antiresonant frequency of the electronic device 20 (which will be called the impedance ratio) was first examined. The result is shown in FIG. 5. The result shows that the greater the impedance ratio, the better is the electrical property of the thin-film bulk acoustic oscillator. Furthermore, the relationship between the FWHM of the rocking curve of the ZnO film as the piezoelectric film 23 and the square $k^2$ of the effective electromechanical coupling coefficient k of the electronic device 20 was examined. The result is shown in FIG. 6. The greater $k^2$, the better is the conversion efficiency between the electrical energy and the mechanical energy of the thin-film bulk acoustic oscillator, which means that the thin-film bulk acoustic oscillator has a good electrical property.

As shown in FIG. 5 and FIG. 6, if the FWHM of the rocking curve of the ZnO film as the piezoelectric film 23 is 3 degrees or smaller, the impedance ratio and the square $k^2$ of the effective electromechanical coupling coefficient k are both desirable. This means that the thin-film bulk acoustic oscillator having an excellent electrical property is fabricated if the FWHM of the rocking curve of the conductor film 13 is 3 degrees or smaller.

Specific examples of the substrate 10 and the electronic device of the embodiment will now be described.

FIRST EXAMPLE

A first example is an example of the substrate 10 for the electronic device. The base 11 of the substrate 10 of this example was made of a substrate of single-crystal Si having a surface on which a thermal-oxidized $SiO_2$ film was formed. The substrate had a thickness of 250 μm and a resistivity of 1000 ohm-cm. The (100) plane of the single-crystal Si was parallel to the surface of the substrate. The surface of the substrate had been mirror-ground in advance and the thermal-oxidized $SiO_2$ film was formed on this surface.

According to the substrate 10 of the example, an AlN film having a thickness of 50 nm as the adhesion film 12 was formed on the base 11. The AlN film was formed as follows. The base 11 was introduced to a vacuum chamber and the chamber was exhausted so that the pressure therein was $1 \times 10^{-4}$ Pa. Next, a mixed gas of Ar and $N_2$ at a flow rate of 25 sccm was introduced to the chamber so that the pressure therein was 0.4 Pa while the temperature of the base 11 was maintained at 200° C. Next, RF magnetron sputtering was performed to form the AlN film on the base 11 with Al as the target while the pressure in the chamber was adjusted to 0.4 Pa.

Figure 7:
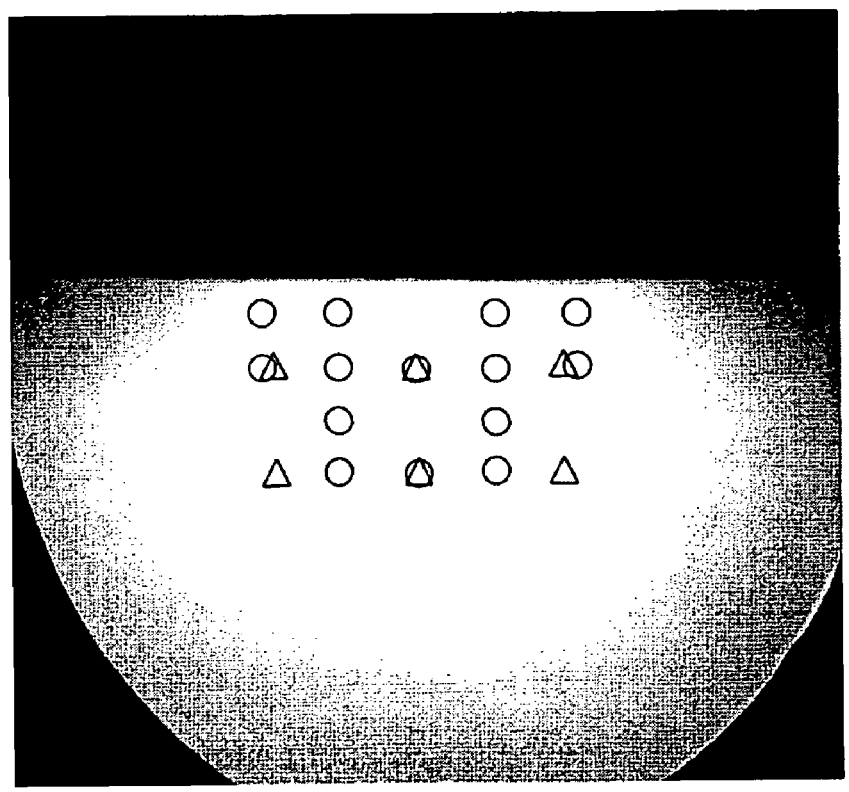
FIG. 7 illustrates the diffraction pattern of the AlN film that is the adhesion film of the substrate for the electronic device of the embodiment obtained through RHEED.

The surface of the AlN film thus formed was observed by RHEED and the diffraction pattern shown in FIG. 7 was obtained. Since it is difficult to clearly show the diffraction pattern in the drawing, diffraction points are indicated with dots (○) and deltas (Δ) in FIG. 7. In FIG. 7 the pattern indicated with dots means that an electron beam entered the (0001) plane from the [11-20] direction. The pattern indicated with deltas means that an electron beam entered the (0001) plane from the [1-100] direction. As shown in FIG. 7, it is noted that the AlN film is a (0001) oriented polycrystalline film that includes a crystal having a wurtzite structure wherein the orientations in the film surface are random and the direction orthogonal to the film surface is the [0001] direction.

Next, on the adhesion film 12, a Pt thin film having a thickness of 100 nm was formed as the conductor film 13 by vacuum deposition to complete the substrate 10. When the Pt thin film was formed, the degree of vacuum was $1 \times 10^{-3}$ Pa and the temperature of the substrate was 600° C.

Next, the property of the substrate 10 thus fabricated was evaluated. The crystallinity of each of the adhesion film 12 and the conductor film 13 was evaluated by X-ray diffraction. The substrate 10 was observed by X-ray diffraction, and the diffraction lines of the (0002) plane reflection of the AlN film as the adhesion film 12 and the (111) plane reflection of the Pt film as the conductor film 13 were only found. Therefore, it was found that the AlN film and the Pt film were both single-oriented films. The FWHM of the rocking curve of the Pt film was 2.5 degrees.

Next, the adhesion property of the conductor film 13 to the base 11 was evaluated by a tape test. No separation of the conductor film 13 occurred. Therefore, it was found that the conductor film 13 had a sufficient adhesion to the base 11.

To make a comparison with the substrate 10 for the electronic device of the example of the embodiment, a reference substrate for an electronic device was fabricated. The reference substrate had a configuration the same as that of the substrate 10 of the example except that the reference substrate did not include the adhesion film 12. The method of manufacturing the reference substrate was the same as that of the substrate 10 except that the method of manufacturing the reference substrate did not include the step of forming the adhesion film 12. The crystallinity and adhesion of the conductor film of the reference substrate were evaluated. The reference substrate had a crystallinity nearly the same as that of the conductor film 13 of the substrate 10 of the example. However, according to the tape test performed on the reference substrate, separation of the conductor film occurred, and the adhesion of the conductor film to the base was poor.

SECOND EXAMPLE

A second example is an example of the substrate 10 for the electronic device, too. The base 11 of the substrate 10 of this example was made of a substrate of single-crystal Si on which an acoustic reflection film was formed. The substrate had a thickness of 250 μm and a resistivity of 1000 ohm-cm. The (100) plane of the single-crystal Si was parallel to the surface of the substrate. The surface of the substrate had been mirror-ground in advance. The acoustic reflection film was formed by stacking four $Al_2O_3$ films each having a thickness of 1500 nm as the first dielectric layers 22A and four $SiO_2$ films each having a thickness of 800 nm as the second dielectric layers 22B alternately in this order on the cleaned surface of the substrate. The $Al_2O_3$ films and the $SiO_2$ films were formed by sputtering.

According to the substrate 10 of the example, on the base 11, an AlN film having a thickness of 50 nm was formed as the adhesion film 12. The AlN film was formed by reactive RF magnetron sputtering through the use of a target of Al and a mixed gas of Ar and $N_2$. The surface of the AlN film thus formed was observed by RHEED and a diffraction pattern similar to the one shown in FIG. 7 was obtained. Therefore, it is noted that the AlN film of the second example was a (0001) oriented polycrystalline film that included a crystal having a wurtzite structure wherein the orientations in the film surface were random and the direction orthogonal to the film surface was the direction. The arithmetic mean roughness Ra of the surface of the AlN film was 2 nm.

According to the second example, on the acoustic reflection film, a Pt film having a thickness of 150 nm was formed as the conductor film 13 by vacuum deposition to complete the substrate 10. When the Pt film was formed, the temperature of the substrate was 400° C. and the rate at which the film was formed was 0.06 nm/second. The conductor film 13 thus formed was a film oriented such that the (111) plane of a face-centered cubic lattice structure was parallel to the surface of the base 11. The FWHM of the rocking curve of the conductor film 13 obtained by X-ray diffraction was 2.5 degrees.

Next, the adhesion property of the conductor film 13 to the base 11 was evaluated by a tape test. No separation of the conductor film 13 occurred. Therefore, it was found that the conductor film 13 had a sufficient adhesion to the base 11.

To make a comparison with the substrate 10 for the electronic device of the example of the embodiment, a reference substrate for an electronic device was fabricated. The reference substrate had a configuration the same as that of the substrate 10 of the example except that the reference substrate did not include the adhesion film 12. The method of manufacturing the reference substrate was the same as that of the substrate 10 except that the method of manufacturing the reference substrate did not include the step of forming the adhesion film 12. The crystallinity and adhesion of the conductor film of the reference substrate were evaluated. The FWHM of the rocking curve of the conductor film of the reference substrate obtained by X-ray diffraction was 10 degrees. Therefore, it was found that the crystallinity of the conductor film of the reference substrate was significantly reduced, compared to that of the conductor film 13 of the substrate 10 of the example including the adhesion film 12. Furthermore, according to the tape test performed on the reference substrate, separation of the conductor film occurred, and the adhesion of the conductor film to the base was poor.

THIRD EXAMPLE

A third example is an example of the electronic device 20. The base 11 of the electronic device 20 of this example was made of a substrate of single-crystal Si on which an acoustic reflection film was formed. The substrate had a thickness of 250 μm and a resistivity of 1000 ohm-cm. The (100) plane of the single-crystal Si was parallel to the surface of the substrate. The surface of the substrate had been mirror-ground in advance. The acoustic reflection film was formed by stacking four AlN films each having a thickness of 1500 nm as the first dielectric layers 22A and four $SiO_2$ films each having a thickness of 800 nm as the second dielectric layers 22B alternately in this order on the cleaned surface of the substrate. The AlN films were formed by sputtering while the $SiO_2$ films were formed by CVD.

According to the electronic device 20 of the example, on the base 11, an AlN film having a thickness of 50 nm was formed as the adhesion film 12. The AlN film was formed by a method the same as that of the second example.

According to the electronic device 20 of this example, on the adhesion film 12, a Pt film having a thickness of 150 nm was formed as the conductor film 13 by vapor deposition. When the Pt film was formed, the temperature of the substrate was 600° C. and the rate at which the film was formed was 0.06 nm/second. The conductor film 13 thus formed was a film oriented such that the (111) plane of a face-centered cubic lattice structure was parallel to the surface of the base 11. The FWHM of the rocking curve of the conductor film 13 obtained by X-ray diffraction was 2.3 degrees.

According to the electronic device 20 of the example, on the conductor film 13, a ZnO film having a thickness of 800 nm was formed as the piezoelectric film 23. The ZnO film was a (0001) oriented film. The FWHM of the rocking curve of the (0002) plane of the ZnO film obtained by X-ray diffraction was 2.5 degrees. It is thereby noted that the ZnO film had an excellent crystallinity.

According to the example, a $SiO_2$ film having a thickness of 50 nm and the upper electrode 24 made of Al were formed one by one on the piezoelectric film 23. A thin-film bulk acoustic oscillator as the electronic device 20 was thereby completed.

The properties of the thin-film bulk acoustic oscillator were measured. The resonant frequency fr was 2.0 GHz. The antiresonant frequency fa was 2.06 GHz. The square of effective electromechanical coupling coefficient, that is, $(fa^2-fr^2)/fr^2$, was 6.0 percent. The impedance ratio was approximately 50 dB. According to this example, as thus described, the thin-film bulk acoustic oscillator having good resonant properties was fabricated.

According to the embodiment, as described so far, the adhesion film 12 is provided between the base 11 and the conductor film 13. The adhesion film 12 is made of a non-epitaxial film including a crystal of a wurtzite structure.

As a result, the embodiment implements the substrate 10 for the electronic device and the electronic device 20 each comprising the conductor film 13 having an excellent crystallinity and an excellent adhesion to the base 11. According to the embodiment, the electronic device 20 having excellent properties is implemented through the use of the above-mentioned substrate 10.

According to the embodiment, the adhesion film 12 is made of a non-epitaxial film. It is thereby possible to form the adhesion film 12 having a good crystallinity at a relatively low temperature, which facilitates manufacture of the substrate 10 and the electronic device 20.

If at least a portion of the base 11 that touches the adhesion film 12 is made of an amorphous material such as glass or $SiO_2$, it is impossible to form an epitaxial film thereon. According to the embodiment, the adhesion film 12 is made of a non-epitaxial film. As a result, even if at least a portion of the base 11 that touches the adhesion film 12 is made of an amorphous material such as glass or $SiO_2$, it is possible to form the adhesion film 12 thereon. It is thereby possible to form the conductor film 13 having an excellent crystallinity and an excellent adhesion to the base 11.

The present invention is not limited to the foregoing embodiment but may be practiced in still other ways. For example, the materials and the methods of forming the layers of the substrate 10 and the electronic device 20 are not limited to the examples illustrated in the embodiment but other materials and methods may be applied.

According to the substrate for the electronic device, the electronic device or the method of manufacturing the substrate or the electronic device of the invention thus described, the substrate for the electronic device or the electronic device comprising the conductor film having an excellent crystallinity and an excellent adhesion to the base is implemented.

According to the electronic device or the method of manufacturing the same of the invention, the electronic device having excellent properties is implemented through the use of the substrate comprising the conductor film having an excellent crystallinity and an excellent adhesion to the base.

Obviously many modifications and variations of the present invention are possible in the light of the above teachings. It is therefore to be understood that within the scope of the appended claims the invention may be practiced otherwise than as specifically described.

What is claimed is:

1. A substrate for an electronic device comprising:
   a base;
   an adhesion film stacked on the base; and
   a conductor film stacked on the adhesion film, wherein
   the adhesion film is a non-epitaxial film including a crystal having a wurtzite crystal structure.

2. The substrate according to claim 1, wherein the adhesion film is a polycrystalline film.

3. The substrate according to claim 1, wherein the adhesion film is a film oriented such that a (0001) plane of the wurtzite crystal structure is parallel to a surface of the base.

4. The substrate according to claim 1, wherein the adhesion film has an arithmetic mean roughness of 10 nanometers or smaller.

5. The substrate according to claim 1, wherein the conductor film is a film that includes a crystal having a face-centered cubic lattice structure and is oriented such that a (111) plane of the face-centered cubic lattice structure is parallel to a surface of the base.

6. The substrate according to claim 1, wherein the conductor film is a film that includes a crystal having a hexagonal close-packed structure and is oriented such that a (0001) plane of the hexagonal close-packed structure is parallel to a surface of the base.

7. The substrate according to claim 1, wherein at least a portion of the base that touches the adhesion film is amorphous.

8. An electronic device comprising a substrate for the electronic device and a functional film having a specific function and disposed on the substrate, the substrate incorporating:
   a base;
   an adhesion film stacked on the base; and
   a conductor film stacked on the adhesion film, wherein
   the adhesion film is a non-epitaxial film including a crystal having a wurtzite crystal structure.

9. The electronic device according to claim 8, wherein the functional film is any of a piezoelectric film, a dielectric film and a semiconductor film.

* * * * *